United States Patent
Yeager et al.

(10) Patent No.: US 6,617,400 B2
(45) Date of Patent: *Sep. 9, 2003

(54) COMPOSITION OF CYCLOALIPHATIC EPOXY RESIN, ANHYDRIDE CURING AGENT AND BORON CATALYST

(75) Inventors: Gary William Yeager, Schenectady, NY (US); Malgorzata Iwona Rubinsztajn, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/935,369

(22) Filed: Aug. 23, 2001

(65) Prior Publication Data

US 2003/0071367 A1 Apr. 17, 2003

(51) Int. Cl.$^7$ .................. C08K 3/10; C08K 5/3435; C08K 5/5398; C08L 63/00
(52) U.S. Cl. .................. 525/533; 523/451; 523/455; 523/456; 523/457; 523/459; 523/461; 523/453
(58) Field of Search .................. 525/533; 523/451, 523/455, 456, 457, 459, 461, 453

(56) References Cited

U.S. PATENT DOCUMENTS

| | | | | |
|---|---|---|---|---|
| 3,338,871 A | | 8/1967 | Vogelzang et al. | |
| 4,026,862 A | * | 5/1977 | Smith et al. | 428/263 |
| 4,178,274 A | | 12/1979 | Denk et al. | 528/297 |
| 4,336,367 A | | 6/1982 | Morris et al. | 524/770 |
| 4,454,201 A | | 6/1984 | Uram, Jr. | 428/413 |
| 4,873,309 A | * | 10/1989 | Corley | 528/102 |
| 4,999,699 A | * | 3/1991 | Christie et al. | 357/65 |
| 5,145,889 A | | 9/1992 | Wada et al. | 523/451 |
| 5,198,479 A | | 3/1993 | Shiobara et al. | 523/214 |
| 5,212,261 A | * | 5/1993 | Stierman | 525/506 |
| 6,180,696 B1 | * | 1/2001 | Wong et al. | 523/457 |
| 6,218,482 B1 | * | 4/2001 | Yamanaka et al. | 525/524 |
| 6,507,049 B1 | * | 1/2003 | Yeager et al. | 257/789 |
| 2003/0071368 A1 | * | 4/2003 | Rubinsztajn | 257/793 |

FOREIGN PATENT DOCUMENTS

| | | | |
|---|---|---|---|
| JP | 58-67051 A2 * | 4/1983 | |
| JP | 60-137046 A * | 7/1985 | |
| JP | 4-209624 A * | 7/1992 | |
| JP | 6-5464 A * | 1/1994 | |
| WO | WO 98/31750 | 7/1998 | |
| WO | WO 98/37134 | 8/1998 | |

* cited by examiner

Primary Examiner—Robert E. L. Sellers
(74) Attorney, Agent, or Firm—Patrick K. Patnode; Christian G. Cabou

(57) ABSTRACT

Epoxy resin compositions are disclosed which comprise (A) at least one cycloaliphatic epoxy resin, (B) at least one anhydride curing agent, (C) at least one a boron containing catalyst that is essentially free of halogen, (D) at least one cure modifier, and, optionally (E) at least one ancillary curing catalyst. The encapsulant may also optionally comprise at least one of thermal stabilizers, UV stabilizers, coupling agents, or refractive index modifiers. Also disclosed are packaged solid state devices comprising a package, a chip, and an encapsulant comprising an epoxy resin composition of the invention. A method of encapsulating a solid state device is also provided.

35 Claims, 3 Drawing Sheets

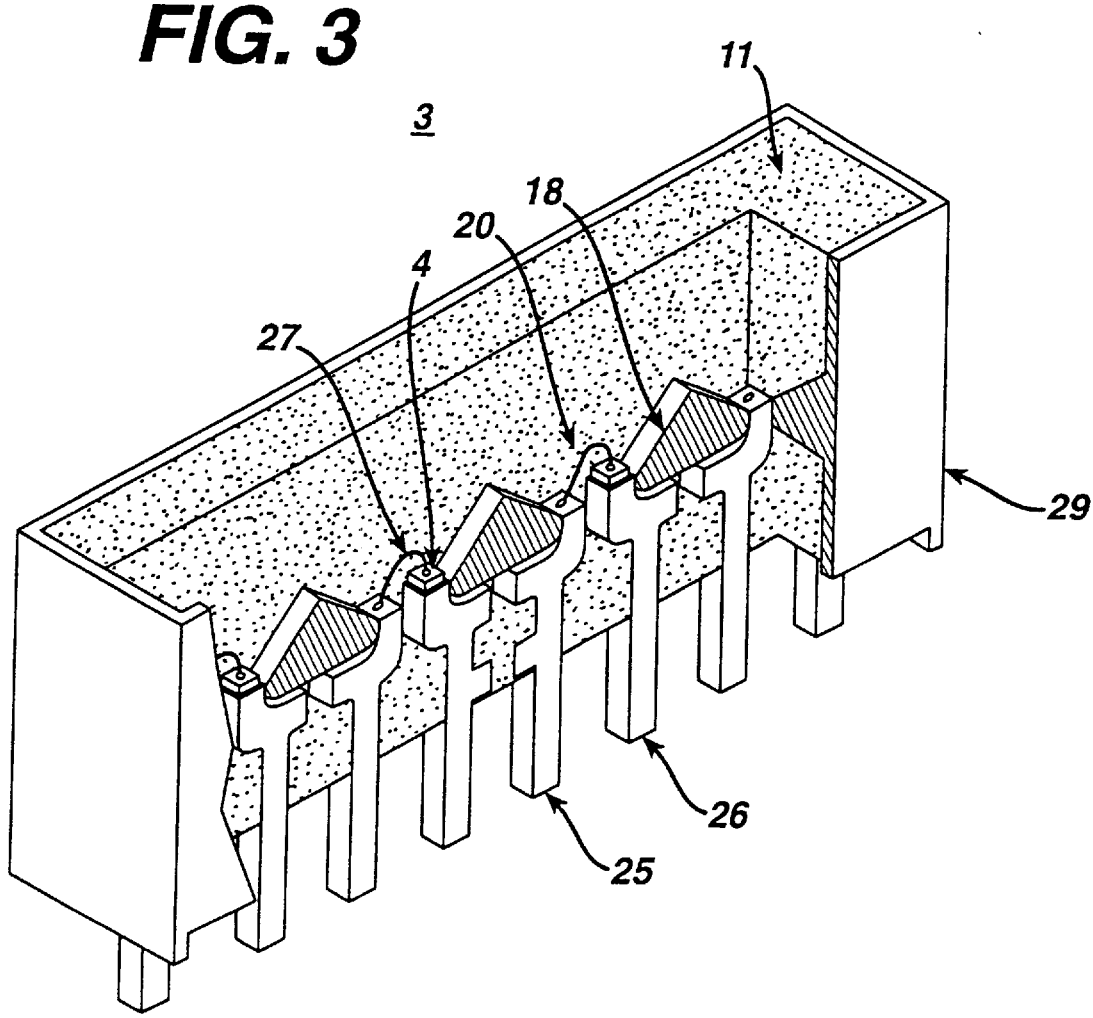

COMPOSITION OF CYCLOALIPHATIC EPOXY RESIN, ANHYDRIDE CURING AGENT AND BORON CATALYST

STATEMENT REGARDING FEDERALLY SPONSORED RESEARCH & DEVELOPMENT

This invention was first conceived or reduced to practice in the performance of work under contract 70NANB8H4022 with the United States National Institute of Standards and Technology (NIST). The United States of America may have certain rights to this invention.

BACKGROUND OF THE INVENTION

This invention relates to packaged solid state devices comprising an encapsulant. The invention also relates to a method for encapsulating a solid state device, such as a light emitting diode (LED).

Solid state devices, sometimes referred to as semiconductor devices or opto-electronic devices, comprise LEDs, CCDs, LSIs, photodiodes, phototransistors, photocouplers, opto-electronic couplers and the like. Such devices often exhibit special packaging needs. High-efficiency, high lumen, solid-state white LEDs require a novel packaging material which can withstand more demanding conditions than those required by typical low-intensity, longer wavelength LEDs. Common packaging materials will often undergo a gradual loss of optical and mechanical properties due to the combination of thermal, oxidative and photodegradation processes.

Resins for encapsulation of solid state devices have primarily relied on blends of bisphenol-A epoxy resins and aliphatic anhydride curing agents. As described in U.S. Pat. No. 4,178,274, to Denk et al., one disadvantage of these compositions, which harden fast through the use of known accelerators such as tertiary amines, imidazoles or boron trifluoride complexes, is their poor thermal aging stability. The materials used heretofore become discolored in extended storage at temperatures above 80° C. The resulting resins, which become yellow to brown, have considerably reduced light transmittancy. Furthermore, because of the aromatic character of bisphenol-A based epoxy resins, these encapsulants are typically less stable to ultraviolet radiation. Therefore, these materials may tend to degrade on extended exposure to light having an ultraviolet component. Such degradation can lead to discoloration of the encapsulant and reduced light transmittance.

To circumvent these issues, Denk et al. describe resin compositions for the sealing of opto-electronic components. These resins comprise a (i) cycloaliphatic epoxy resin, (ii) a carbonic acid anhydride (iii) zinc octoate and (iv) a solvent selected from the group consisting of a low molecular weight polyol, a low molecular weight ester and mixtures thereof. The compositions in Denk et al. are at most 46% epoxy resin by weight. Such low levels of epoxy resin and concomitant high levels of curing agents can lead to color formation in the cured resin, reducing the overall transmittance of a LED.

Wada et al. in U.S. Pat. No. 5,145,889 describe a composition consisting essentially of (i) 100 parts by weight of an epoxy resin (ii) 70 to 140 parts by weight of a curing agent including an acid anhydride (iii) 0.5 to 4.0 parts by weight of a curing accelerator including an onium or diazabicycloalkene salt (iv) 0.5 to 5.0 parts by weight of a phosphorus triphosphite and (v) 0.5 to 5.0 parts by weight of a silane coupling agent represented certain formulas. The compositions in Wada et al. are at most 58% epoxy resin by weight. Such high levels of curing agents can lead to color formation during thermal curing of the resin encapsulant, reducing the overall transmittance of a LED. Furthermore, said encapsulating resin requires the use of a cure accelerator such as an onium or diazabicycloalkene salts to enhance cure rates and allow for reasonable processing times.

Uram in U.S. Pat. No. 4,454,201 describes transparent composite compositions for applications, such as windows for military helicopters, which would require transparency, resistance to heat, abrasion and to penetration by projectiles. A transparent layer in the composite comprises a blend of (i) from about 80 to about 100 parts by weight of an epoxy resin (ii) from about 5 to about 30 parts by weight of a boroxine, such as trimethoxyboroxine (iii) from about 1 part to about 40 parts by weight of an organic phosphorus compound having a specific structure. Whereas this patent teaches boroxine cured epoxy resins in composite applications for military use, encapsulation of opto-electronic devices is not described. Further the benefits of non-aromatic epoxy resins in combination with boroxine curatives for encapsulation of opto-electronic devices is not taught.

Morris in U.S. Pat. No. 4,336,367 describes an adhesive composition for attachment of ordnance devices to the bottom of ships. This composition comprises a mixture of a (i) 3,4-epoxycyclohexylalkyl-3,4-epoxycyclohexane-carboxylate, exo-exo bis(2,3-epoxycyclopentyl) ether, endo-exo bis(2,3-epoxycyclopentyl) ether and (ii) a trialkoxyboroxine. Whereas these epoxy compositions are cycloaliphatic in nature, they are developed for adhesive applications and the use of said compositions for encapsulation of opto-electronic devices was not envisioned.

In copending, commonly owned application Ser. No. 09/654,830, filed Sep. 1, 2000, U.S. Pat. No. 6,507,049, there is disclosed a composition for the packaging of opto-electronic devices which comprises 1) an epoxy resin and 2) a boron containing catalyst essentially free of halogen. Whereas these materials have excellent optical properties, the thermal properties and moisture absorption characteristics were not optimal for certain opto-electronic applications.

There is a continuing need for novel packaging material for solid state devices, such packaging material desirably possessing properties such as high transmission in a range from near UV to the visible wavelength; long term thermal, oxidative and UV stability; thermal compliance with other materials used to envelope the solid state device; low color; and high reflective index.

SUMMARY OF THE INVENTION

The present inventors have discovered curable resin compositions ideally suited for an encapsulation of solid state devices such as light emitting diodes. In one embodiment the present invention relates to a packaged solid state device comprising: (a) a package; (b) a chip; and (c) an encapsulant comprising: (A) at least one cycloaliphatic epoxy resin, (3) at least one anhydride curing agent, (C) at least one a boron containing catalyst that is essentially free of halogen, (D) at least one cure modifier, and, optionally (E) at least one ancillary curing catalyst.

In another embodiment of the present invention, there is provided a method of encapsulating a solid state device comprising: placing a solid state device into a package; and providing an encapsulant comprising: (A) at least one cycloaliphatic epoxy resin, (B) at least one anhydride curing agent, (C) at least one a boron containing catalyst that is essentially free of halogen, (D) at least one cure modifier, and, optionally (E) at least one ancillary curing catalyst.

Various other features, aspects, and advantages of the present invention will become more apparent with reference to the following description and appended claims.

BRIEF DESCRIPTION OF THE DRAWINGS

FIG. 3 is a schematic illustration of a LED according to still another embodiment of the present invention.

DETAILED DESCRIPTION

Figure 1:
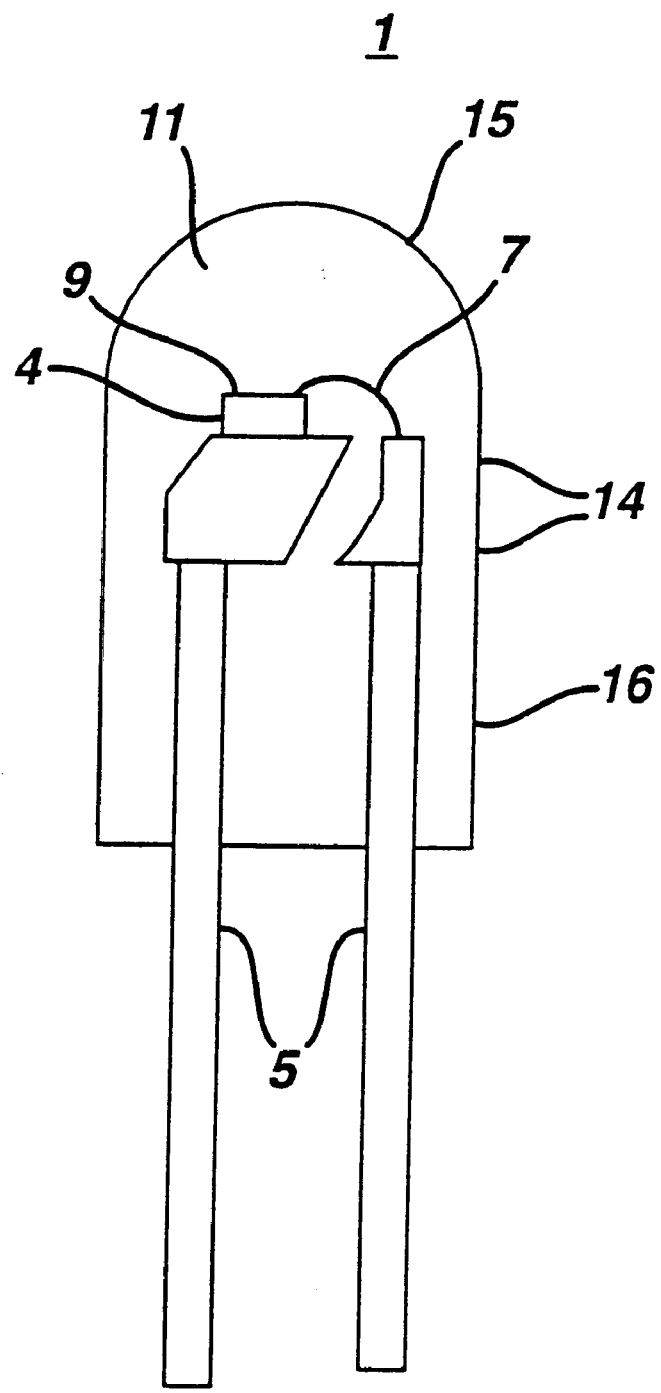
FIG. 1 is a schematic illustration of a LED according to one embodiment of the present invention.

Epoxy resins useful as component (A) in the encapsulants of present invention comprise those described in "Chemistry and Technology of the Epoxy Resins," B. Ellis (Ed.) Chapman Hall 1993, New York and in "Epoxy Resins Chemistry and Technology", edited by C. A. May, Marcel Dekker, New York, 2nd edition, 1988. Epoxy resins that can be used for the present invention comprise those that could be produced by reaction of a hydroxyl, carboxyl or amine containing compound with epichlorohydrin, preferably in the presence of a basic catalyst, such as a metal hydroxide, for example sodium hydroxide. Epoxy resins that can be used for the present invention also comprise those that could be produced by reaction of a compound containing at least one and preferably two or more carbon—carbon double bonds with a peroxide, such as a peroxyacid.

In various embodiments epoxy resins for the present invention comprise cycloaliphatic and aliphatic epoxy resins. Aliphatic epoxy resins comprise compounds that contain at least one aliphatic group and at least one epoxy group. Examples of aliphatic epoxies comprise butadiene dioxide, dimethylpentane dioxide, diglycidyl ether, 1,4-butanedioldiglycidyl ether, diethylene glycol diglycidyl ether, and dipentene dioxide.

Cycloaliphatic epoxy resins are well known to the art and comprise compounds that contain at least about one cycloaliphatic group and at least one oxirane group. In various embodiments cycloaliphatic epoxies comprise compounds that contain at least one cycloaliphatic group and at least two oxirane rings per molecule. Specific examples comprise 2-(3,4-epoxy)cyclohexyl-5,5-spiro-(3,4-epoxy)cyclohexane-m-dioxane, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, vinyl cyclohexanedioxide, bis(3,4-epoxycyclohexylmethyl)adipate, bis(3,4-epoxy-6-methylcyclohexylmethyl)adipate, exo-exo bis(2,3-epoxycyclopentyl)ether, endo-exo bis(2,3-epoxycyclopentyl)ether, 2,2-bis(4-(2,3-epoxypropoxy)cyclohexyl)propane, 2,6-bis(2,3-epoxypropoxycyclohexyl-p-dioxane), 2,6-bis(2,3-epoxypropoxy)norbornene, the diglycidylether of linoleic acid dimer, limonene dioxide, 2,2-bis(3,4-epoxycyclohexyl)propane, dicyclopentadiene dioxide, 1,2-epoxy-6-(2,3-epoxypropoxy)hexahydro-4,7-methanoindane, p-(2,3-epoxy)cyclopentylphenyl-2,3-epoxypropylether, 1-(2,3-epoxypropoxy)phenyl-5,6-epoxyhexahydro-4,7-methanoindane, o-(2,3-epoxy)cyclopentylphenyl-2,3-epoxypropyl ether), 1,2-bis[5-(1,2-epoxy)-4,7-hexahydromethanoindanoxyl]ethane, cyclopentenylphenyl glycidyl ether, cyclohexanediol diglycidyl ether, and diglycidyl hexahydrophthalate. In particular embodiments cycloaliphatic epoxy resins are 3,4-epoxycyclohexylmethyl-3,4-epoxycyclohexanecarboxylate and 3,4-epoxy-6-methylcyclohexylmethyl-3,4-epoxy-6-methylcyclohexanecarboxylate Aromatic epoxy resins may also be used with the present invention, but are not as advantageous as cycloaliphatic and aliphatic compounds due to the greater tendency of aromatic resins to discolor. Additives such as thermal stabilizers or antioxidants may be used with aromatic epoxy resins to lessen discoloring. Thus, examples of epoxy resins useful in the present invention also comprise bisphenol-A epoxy resins, bisphenol-F epoxy resins, phenol novolac epoxy resins, cresol-novolac epoxy resins, biphenol epoxy resins, biphenyl epoxy resins, 4,4'-biphenyl epoxy resins, polyfunctional epoxy resins, divinylbenzene dioxide, and 2-glycidylphenylglycidyl ether. When resins, including aromatic, aliphatic and cycloaliphatic resins are described throughout the specification and claims, either the specifically-named resin or molecules having a moiety of the named resin are envisioned. Also useful are aliphatic epoxy resins that may be used as flexibilizers in the formulation. These comprise aliphatic epoxy resins, such as butane dioldiglycidyl ether and siloxane resins.

Anhydride curing agents useful as component (B) in the encapsulants of present invention comprise those known in the art. Illustrative examples are described in "Chemistry and Technology of the Epoxy Resins" B. Ellis (Ed.) Chapman Hall, New York, 1993 and in "Epoxy Resins Chemistry and Technology", edited by C. A. May, Marcel Dekker, New York, 2nd edition, 1988. In various embodiments anhydride curing agents comprise at least one of bicyclo[2.2.1]hept-5-ene-2,3-dicarboxylic anhydride, methylbicyclo[2.2.1]hept-5-ene-2,3-dicarboxylic anhydride, bicyclo[2.2.1]hept-5-ene-2,3-dicarboxylic anhydride, phthalic anhydride, pyromellitic dianhydride, hexahydrophthalic anhydride, dodecenylsuccinic anhydride, dichloromaleic anhydride, chlorendic anhydride, tetrachlorophthalic anhydride, and the like. Mixtures comprising at least two anhydride curing agents may also be used.

Boron-containing catalysts useful as component (C) in the encapsulants of present invention comprise those that are essentially free of halogen. The term essentially free of halogen means that halogen is not present in the boron catalyst or present in such minute quantities that the encapsulant end product is not substantially discolored by the presence of minute quantities of halogen. Such materials comprise those of formulas (I) and (II):

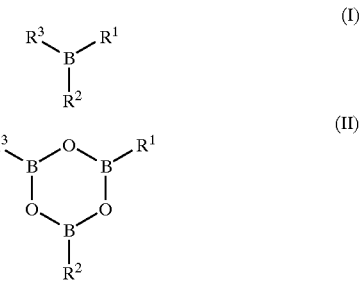

wherein $R^1$–$R^3$ are $C_{1-20}$ aryl, alkyl or cycloalkyl residues and substituted derivatives thereof, or $C_{1-20}$ aryloxy, alkyloxy or cycloalkoxy residues and substituted derivatives thereof. In some embodiments the aforementioned catalysts comprise triphenylborate, tributylborate, trihexylborate, tricyclohexylborate, triphenylboroxine, trimethylboroxine, tributylboroxine, trimethoxyboroxine, and tributoxyboroxine.

Cure modifiers may modify the rate of cure of epoxy resin. In various embodiments cure modifiers useful as component (D) in the present invention comprise at least one of cure accelerators or cure inhibitors. Cure modifiers may comprise compounds containing heteroatoms that possess lone electron pairs. In various embodiments cure modifiers comprise alcohols such as polyfunctional alcohols such as diols, triols, etc., and bisphenols, trisphenols, etc. Further, the alcohol group in such compounds may be primary, secondary or tertiary, or mixtures thereof. In particular embodiments the alcohol group is secondary or tertiary. Representative examples comprise benzyl alcohol, cyclohexanemethanol, alkyl diols, cyclohexanedimethanol, ethylene glycol, propylene glycol, butanediol, pentanediol, hexanediol, heptanediol, octanediol, polyethylene glycol, glycerol, polyether polyols such as those sold under the trade name VORANOL by the Dow Chemical Company, and the like. Phosphites may also be used as cure modifiers. Illustrative examples of phosphites comprise trialkylphosphites, triarylphosphites, trialkylthiophosphites, and triarylthiophosphites. In some embodiments phosphites comprise triphenyl phosphite, benzyldiethyl phosphite, or tributyl phosphite. Other suitable cure modifiers comprise sterically hindered amines and 2,2,6,6-tetramethylpiperidyl residues, such as for example bis(2,2,6,6-tetramethylpiperidyl) sebacate. Mixtures of cure modifiers may also be employed.

The amounts of cycloaliphatic epoxy resin (A), anhydride curing agent (B), boron containing catalyst (C), and cure modifier (D) can be varied over a wide range. In various embodiments the amount of cycloaliphatic epoxy resin (A) in the composition is greater than about 60% by weight based on the combined weight of cycloaliphatic epoxy resin (A), anhydride curing agent (B), boron containing catalyst (C), cure modifier (D), and optional ancillary curing catalyst (E). In some embodiments the amount of cycloaliphatic epoxy resin (A) in the composition is in a range of between about 60% by weight and about 92% by weight based on the combined weight of cycloaliphatic epoxy resin (A), anhydride curing agent (B), boron containing catalyst (C), cure modifier (D), and optional ancillary curing catalyst (E). In other embodiments the amount of cycloaliphatic epoxy resin (A) in the composition is in a range of between about 68% by weight and about 80% by weight based on the combined weight of cycloaliphatic epoxy resin (A), anhydride curing agent (B), boron containing catalyst (C), cure modifier (D), and optional ancillary curing catalyst (E).

In various embodiments the amount of anhydride curing agent (B) in the composition is in a range of between about 1% by weight and about 30% by weight based on the combined weight of cycloaliphatic epoxy resin (A), anhydride curing agent (B), boron containing catalyst (C), cure modifier (D), and optional ancillary curing catalyst (E). In other embodiments the amount of anhydride curing agent (B) in the composition is in a range of between about 2% by weight and about 26% by weight based on the combined weight of cycloaliphatic epoxy resin (A), anhydride curing agent (B), boron containing catalyst (C), cure modifier (D), and optional ancillary curing catalyst (E). In some embodiments the amount of anhydride curing agent (B) in the composition is in a range of between about 4% by weight and about 24% by weight based on the combined weight of cycloaliphatic epoxy resin (A), anhydride curing agent (B), boron containing catalyst (C), cure modifier (D), and optional ancillary curing catalyst (E).

In various embodiments the amount of boron containing catalyst (C) in the composition is less than about 8% by weight based on the combined weight of cycloaliphatic epoxy resin (A), anhydride curing agent (B), boron containing catalyst (C), cure modifier (D), and optional ancillary curing catalyst (E). In other embodiments the amount of boron containing catalyst (C) in the composition is less than about 6% by weight based on the combined weight of cycloaliphatic epoxy resin (A), anhydride curing agent (B), boron containing catalyst (C), cure modifier (D), and optional ancillary curing catalyst (E). In some embodiments the amount of boron containing catalyst (C) in the composition is in a range of between about 0.4% by weight and about 6% by weight based on the combined weight of cycloaliphatic epoxy resin (A), anhydride curing agent (B), boron containing catalyst (C), cure modifier (D), and optional ancillary curing catalyst (E). In other embodiments the amount of boron containing catalyst (C) in the composition is in a range of between about 1% by weight and about 6% by weight based on the combined weight of cycloaliphatic epoxy resin (A), anhydride curing agent (B), boron containing catalyst (C), cure modifier (D), and optional ancillary curing catalyst (E).

In various embodiments the amount of cure modifier (D) in the composition is less than about 8% by weight based on the combined weight of cycloaliphatic epoxy resin (A), anhydride curing agent (B), boron containing catalyst (C), cure modifier (D), and optional ancillary curing catalyst (E). In other embodiments the amount of cure modifier (D) in the composition is less than about 6% by weight based on the combined weight of cycloaliphatic epoxy resin (A), anhydride curing agent (B), boron containing catalyst (C), cure modifier (D), and optional ancillary curing catalyst (E). In some embodiments the amount of cure modifier (D) in the composition is in a range of between about 0.4% by weight and about 6% by weight based on the combined weight of cycloaliphatic epoxy resin (A), anhydride curing agent (B), boron containing catalyst (C), cure modifier (D), and optional ancillary curing catalyst (E). In other embodiments the amount of cure modifier (D) in the composition is in a range of between about 1% by weight and about 6% by weight based on the combined weight of cycloaliphatic epoxy resin (A), anhydride curing agent (B), boron containing catalyst (C), cure modifier (D), and optional ancillary curing catalyst (E).

In various embodiments the compositions of the invention comprise cycloaliphatic epoxy resin (A) and anhydride curing agent (B) in a molar ratio of anhydride to epoxy of less than 1. In one embodiment the molar ratio of anhydride to epoxy is less than about 0.85; in another embodiment less than about 0.58; and in still another embodiment less than about 0.37.

Ancillary curing catalysts useful as optional component (E) in the present invention comprise those known in the art. Illustrative examples include those in "Chemistry and Technology of the Epoxy Resins" edited by B. Ellis, Chapman Hall, New York, 1993, and in "Epoxy Resins Chemistry and Technology", edited by C. A. May, Marcel Dekker, New York, 2nd edition, 1988. In various embodiments the ancillary curing catalyst comprises an organometallic salt, a sulfonium salt or an iodonium salt. In particular embodiments the ancillary curing catalyst comprises at least one of a metal carboxylate, a metal acetylacetonate, zinc octoate, stannous octoate, triarylsulfonium hexafluorophosphate, triarylsulfonium hexafluoroantimonate (such as CD 1010 sold by Sartomer Corporation), diaryliodonium hexafluoroantimonate, or diaryliodonium tetrakis (pentafluorophenyl)borate. In various embodiments the amount of ancillary curing catalyst (E) in the composition is less than about 10% by weight based on the combined weight of cycloaliphatic epoxy resin (A), anhydride curing agent (B), boron containing catalyst (C), cure modifier (D), and ancillary curing catalyst (E). In some embodiments the amount of ancillary curing catalyst (E) in the composition is in a range between about 0.01% by weight and about 10% by weight based on the combined weight of cycloaliphatic epoxy resin (A), anhydride curing agent (B), boron containing catalyst (C), cure modifier (D), and ancillary curing catalyst (E). In other embodiments the amount of ancillary curing catalyst (E) in the composition is in a range between about 0.05% by weight and about 5% by weight based on the combined weight of cycloaliphatic epoxy resin (A), anhydride curing agent (3), boron containing catalyst (C), cure modifier (D), and ancillary curing catalyst (E). In some embodiments the amount of ancillary curing catalyst (E) in the composition is in a range between about 0.05% by weight and about 1.0% by weight based on the combined weight of cycloaliphatic epoxy resin (A), anhydride curing agent (B), boron containing catalyst (C), cure modifier (D), and ancillary curing catalyst (E). In other embodiments the amount of ancillary curing catalyst (E) in the composition is in a range between about 0.05% by weight and about 0.5% by weight based on the combined weight of cycloaliphatic epoxy resin (A), anhydride curing agent (B), boron containing catalyst (C), cure modifier (D), and ancillary curing catalyst (E).

Other possible curing agents or catalysts comprise those mentioned in "Chemistry and Technology of the Epoxy Resins," B. Ellis (Ed.) Chapman Hall 1993, New York and in "Epoxy Resins Chemistry and Technology", edited by C. A. May, Marcel Dekker, New York, 2nd edition, 1988.

One or more thermal stabilizers or UV-stabilizers or mixtures thereof may optionally be present in the compositions of the invention. Such stabilizers may reduce color formation during processing of the encapsulant. Many stabilizers to improve the thermal and or UV stability are known in the art and have been described in numerous patents and publications such as in J. F. Rabek, "Photostabilization of Polymers; Principles and Applications", Elsevier Applied Science, NY, 1990 and in "Plastics Additives Handbook", 5th edition, edited by H. Zweifel, Hanser Publishers, 2001. Illustrative examples of suitable stabilizers comprise organic phosphites and phosphonites, such as triphenyl phosphite, diphenylalkyl phosphites, phenyldialkyl phosphites, tri-(nonylphenyl) phosphite, trilauryl phosphite, trioctadecyl phosphite, di-stearyl-pentaerythritol diphosphite, tris-(2,4-di-tert-butylphenyl)phosphite, di-isodecylpentaerythritol diphosphite, di-(2,4-di-tert-butylphenyl)pentaerythritol diphosphite, tristearyl-sorbitol triphosphite, and tetrakis-(2,4-di-tert-butylphenyl)-4,4'-biphenyldiphosphonite. Illustrative examples of suitable stabilizers also comprise sulfur-containing phosphorus compounds such as trismethylthiophosphite, trisethylthiophosphite, trispropylthiophosphite, trispentylthiophosphite, trishexylthiophosphite, trisheptylthiophosphite, trisoctylthiophosphite, trisnonylthiophosphite, trislaurylthiophosphite, trisphenylthiophosphite, trisbenzylthiophosphite, bispropiothiomethylphosphite, bispropiothiononylphosphite, bisnonylthiomethylphosphite, bisnonylthiobutylphosphite, methylethylthiobutylphosphite, methylethylthiopropiophosphite, methylnonylthiobutylphosphite, methylnonylthiolaurylphosphite, and pentylnonylthiolaurylphosphite. These compounds can be used singly or in a combination of at least two compounds.

Suitable stabilizers also comprise sterically hindered phenols which are known in the art. Illustrative examples of sterically hindered phenol stabilizers comprise 2-tertiary-alkyl-substituted phenol derivatives, 2-tertiary-amyl-substituted phenol derivatives, 2-tertiary-octyl-substituted phenol derivatives, 2-tertiary-butyl-substituted phenol derivatives, 2,6-di-tertiary-butyl-substituted phenol derivatives, 2-tertiary-butyl-6-methyl-(or 6-methylene-) substituted phenol derivatives, and 2,6-di-methyl-substituted phenol derivatives. These compounds can be used singly or in a combination of at least two compounds. In certain particular embodiments sterically hindered phenol stabilizers comprise alpha-tocopherol and butylated hydroxy toluene.

Suitable stabilizers also comprise sterically hindered amines, illustrative examples of which comprise bis-(2,2,6,6-tetramethylpiperidyl)sebacate, bis-(1,2,2,6,6-pentamethylpiperidyl)sebacate, n-butyl-3,5-di-tert-butyl-4-hydroxybenzyl malonic acid bis-(1,2,2,6,6-pentamethylpiperidyl)ester, condensation product of 1-hydroxyethyl-2,2,6,6-tetramethyl-4-hydroxypiperidine and succinic acid, condensation product of N,N'-(2,2,6,6-tetramethylpiperidyl)-hexamethylenediamine and 4-tert-octyl-amino-2,6-dichloro-s-triazine, tris-(2,2,6,6-tetramethylpiperidyl)-nitrilotriacetate, tetrakis-(2,2,6,6-tetramethyl-4-piperidyl)-1,2,3,4-butanetetracarboxylate, and 1,1'-(1,2-ethanediyl)-bis-(3,3,5,5-tetramethylpiperazinone). These compounds can be used singly or in a combination of at least two compounds.

Suitable stabilizers also comprise compounds which destroy peroxide, illustrative examples of which comprise esters of beta-thiodipropionic acid, for example the lauryl, stearyl, myristyl or tridecyl esters; mercaptobenzimidazole or the zinc salt of 2-mercaptobenzimidazole; zinc dibutyl-dithiocarbamate; dioctadecyl disulfide; and pentaerythritol tetrakis-(beta-dodecylmercapto)-propionate. These compounds can be used singly or in a combination of at least two compounds.

Optional components in the present invention also comprise coupling agents which in various embodiments may help epoxy resin bind to a matrix, such as a glass matrix, so as to form a strong bond to the surface such that premature failure does not occur. Coupling agents comprise compounds that contain both silane and mercapto moieties, illustrative examples of which comprise mercaptomethyltriphenylsilane, beta-mercaptoethyltriphenylsilane, beta-mercaptopropyltriphenylsilane, gamma-mercaptopropyldiphenylmethylsilane, gamma-mercaptopropylphenyldimethylsilane, delta-mercaptobutylphenyldimethylsilane, delta-mercaptobutyltriphenylsilane, tris(beta-mercaptoethyl)phenylsilane, tris(gamma-mercaptopropyl)phenylsilane, tris(gamma-mercaptopropyl)methylsilane, tris(gamma-mercaptopropyl)ethylsilane, and tris(gamma-mercaptopropyl)benzylsilane. Coupling agents also comprise compounds which comprise both an alkoxysilane and an organic moiety, illustrative examples of which comprise compounds of the formula $(R^5O)_3Si-R^6$ wherein $R^5$ is an alkyl group and $R^6$ is selected from the group consisting of vinyl, 3-glycidoxypropyl, 3-mercaptopropyl, 3-acryloxypropyl, 3-methacryloxypropyl, and $C_nH_{2n+1}$. In some embodiments $R^5$ is methyl or ethyl, and n has the value of 4–16. In other embodiments coupling agents comprise those comprising both an alkoxysilane and an epoxy moiety. Coupling agents can be used singly or in a combination of at least two compounds.

Optional components in the present invention also comprise refractive index modifiers. As light passes from the relatively high index of diffraction chip (typically 2.8–3.2) to the lower refractive index epoxy encapsulant (typically 1.2–1.6) some of the light is reflected back to the chip at the critical angle. Modifiers with high refractive index added to the epoxy increase its refractive index, producing a better match of the two refractive indices and an increase in the amount of emitted light. Such materials increase the refractive index of the epoxy without significantly affecting the transparency of the epoxy encapsulant. Modifiers of this type comprise additives with high refractive index. These materials comprise optically transparent organics or inorganics, and agglomerates of particles or structures whose size is less than the size of the wavelength of the emitted light. Such agglomerates are sometimes referred to as nanoparticles. Such materials are known in the art and comprise a variety of transparent metal oxides or group II-VI materials that are relatively free from scattering. In one embodiment, a nanoparticle material is titanium dioxide. In other embodiments other types of transparent metal oxides or combinations of metal oxides can be used. For example, magnesium oxide, yttria, zirconia, cerium oxides, alumina, lead oxides, and composite materials such as those comprising yttria and zirconia can be used to produce nanoparticles. In yet other embodiments nanoparticles are made from one of the group II-VI materials comprising zinc selenide, zinc sulphide, and alloys made from Zn, Se, S, and Te. Alternatively, gallium nitride, silicon nitride, or aluminum nitride can be also used to make nanoparticles.

The compositions of the present invention can be prepared by combining the various components, including optional components, in any convenient order. In various embodiments all the components may be mixed together. In other embodiments two or more components may be premixed and then subsequently combined with other components. In one embodiment the components of the compositions of the invention comprise a two-part composition, wherein the various components are premixed in at least two separate compositions before combination to provide a final composition.

Encapsulation techniques for solid state devices are well known to the art and may be used in the present invention. In various embodiments such techniques comprise casting, resin transfer molding and the like. After the solid state device is enveloped in the uncured resin, typically performed in a mold, the resin is cured. These resins may be cured in one or more stages using art-known methods comprising thermal, UV or electron beam techniques or combination thereof. For example, thermal cure may be performed at temperatures in one embodiment in a range of from about room temperature to about 200° C., in another embodiment in a range of from about 80° C. to about 200° C., in another embodiment in a range of from about 100° C. to about 200° C., and in another embodiment in a range of from about 120° C. to about 160° C. Also in other embodiments these materials can be photo-chemically cured, initially at about room temperature, using art-known techniques. Although some thermal excursion from the photochemical reaction and subsequent cure can occur, no external heating is typically required. In other embodiments these materials may be cured in two stages wherein an initial thermal or UV cure, for example, may be used to produce a partially hardened or B-staged epoxy resin. This material, which is easily handled, may then be further cured using, for example, either thermal or UV techniques, to produce a material with the desired thermal performance (for example Tg, CTE), optical properties and moisture resistance required for encapsulated solid state devices.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

EXAMPLES 1–5

Epoxy resin encapsulants were prepared by combining the epoxy resins and curing agents as shown in Table 1 and curing under the specified conditions. Sub-stoichiometric amounts of anhydride were employed. All quantities are in parts by weight. The abbreviation "RT" means room temperature.

TABLE 1

| Component | Ex. 1 | Ex. 2 | Ex. 3 | Ex. 4 | Ex. 5 |
|---|---|---|---|---|---|
| Component A | | | | | |
| 3,4-epoxycyclohexyl-methyl-3,4-epoxycyclo-hexanecarboxylate (ERL 4221D) | 66 | 75 | 69 | 71 | 73 |
| Component B | | | | | |
| hexahydrophthalic anhydride | 33 | 17 | 24 | 14 | 7 |
| Component C | | | | | |
| trimethoxyboroxine | — | 2 | 2 | 4 | 6 |
| Component D | | | | | |
| stannous octoate | 0.5 | 0.1 | 0.1 | 0.1 | 0.1 |
| Component E | | | | | |
| 2,5-hexanediol | — | 2 | 2 | 4 | 6 |
| Component F | | | | | |
| triphenyl phosphite | — | 2 | 1 | 3 | 4 |
| Component G | | | | | |
| glycidoxypropyltri-methoxy-silane | — | 2 | 1 | 3 | 4 |
| Processing | | | | | |
| Cure time, time (hrs.)/ temp. (° C.) | 3/150 | 3/110 | 3/110 | 16/RT, then 3/80 | 16/RT, then 3/80 |
| Properties | | | | | |
| Tg (° C.) | 97 | 154 | 154 | 142 | 138 |
| CTE, μh/m° C. (below/above TG) | 87/213 | 54/164 | 66/175 | 64/178 | 63/204 |
| YI, initial | 10.6 | 2.9 | 2.8 | 1.4 | 0.9 |
| YI, aged for 96 hrs. at 150° C. | 19.5 | 12.2 | 21.4 | 27 | 34.5 |

As shown in Table 1 the use of sub-stoichiometric levels of anhydride leads to improved color. More importantly the levels of anhydride given in Table 1 are lower than previously used in the art for the encapsulation of light emitting diode devices.

The epoxy resin compositions of the present invention can be used in applications known for epoxy resin compositions. Such applications comprise coatings, potting compounds, and encapsulants for solid state devices. In one embodiment a solid state device is a LED. FIG. 1 schematically illustrates a LED 1 according to one embodiment of the present invention. The LED 1 contains a LED chip 4, which is electrically connected to a lead frame 5. For example, the LED chip 4 may be directly electrically connected to an anode or cathode electrode of the lead frame 5 and connected by a lead 7 to the opposite cathode or anode electrode of the lead frame 5, as illustrated in FIG. 1. In a particular embodiment illustrated in FIG. 1, the lead frame 5 supports the LED chip 4. However, the lead 7 may be omitted, and the LED chip 4 may straddle both electrodes of the lead frame 5 with the bottom of the LED chip 4 containing the contact layers, which contact both the anode and cathode electrode of the lead frame 5. Alternatively, the LED chip 4 may be connected with a separate lead 7 to the cathode and the anode electrode of the lead frame 5. The lead frame 5 connects to a power supply, such as a current or voltage source or to another circuit (not shown).

The LED chip 4 emits radiation from the radiation emitting surface 9. The LED may emit visible, ultraviolet or infrared radiation. The LED chip may comprise any LED chip containing a p-n junction of any semiconductor layers capable of emitting the desired radiation. For example, the LED chip may contain any desired Group III-V compound semiconductor layers, such as GaAs, GaAlAs, GaN, InGaN, GaP, etc., or Group II-VI compound semiconductor layers such ZnSe, ZnSSe, CdTe, etc., or Group IV-IV semiconductor layers, such as SiC. The LED chip 4 may also contain other layers, such as cladding layers, waveguide layers and contact layers.

The LED 1 is packaged with an encapsulant 11 of the present invention. An alternative term for encapsulant is encapsulating material. In one embodiment the LED packaging includes encapsulant 11 located in a package, such as a shell 14. The shell may be any plastic or other material, such as polycarbonate, which is transparent to the LED radiation. However, the shell 14 may be omitted to simplify processing if encapsulant 11 has sufficient toughness and rigidity to be used without a shell. Thus, the outer surface of encapsulant 11 would act in some embodiments as a shell 14 or package. The shell 14 contains a light or radiation emitting surface 15 above the LED chip 4 and a non-emitting surface 16 adjacent to the lead frame 5. The radiation emitting surface 15 may be curved to act as a lens and/or may be colored to act as a filter. In various embodiments the non-emitting surface 16 may be opaque to the LED radiation, and may be made of opaque materials such as metal. The shell 14 may also contain a reflector around the LED chip 4, or other components, such as resistors, etc., if desired.

In other embodiments encapsulating materials may optionally contain a phosphor to optimize the color output of the LED 1. For example, a phosphor may be interspersed or mixed as a phosphor powder with encapsulant 11 or coated as a thin film on the LED chip 4 or coated on the inner surface of the shell 14. Any phosphor material may be used with the LED chip. For example, a yellow emitting cerium doped yttrium aluminum garnet phosphor (YAG:Ce$^{3+}$) may be used with a blue emitting InGaN active layer LED chip to produce a visible yellow and blue light output which appears white to a human observer. Other combinations of LED chips and phosphors may be used as desired.

While the packaged LED chip 4 according to one embodiment illustrated in FIG. 1 is supported by the lead frame 5, the LED 1 can have various other structures. For example, the LED chip 4 may be supported by the bottom surface 16 of the shell 14 or by a pedestal (not shown) located on the bottom of the shell 14, instead of by the lead frame 5.

Figure 2:
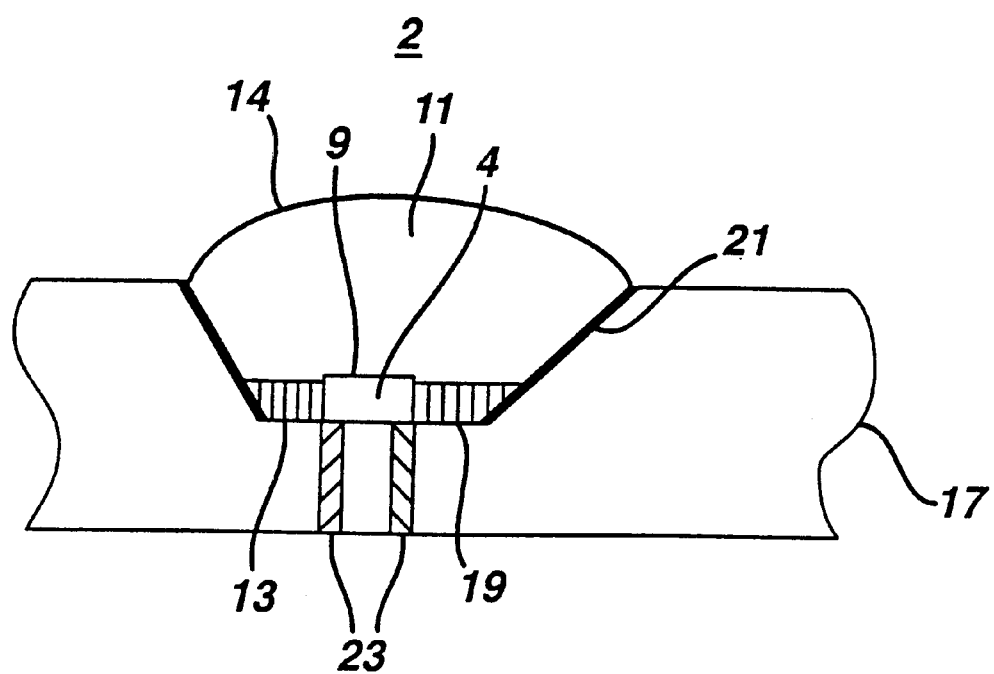
FIG. 2 is a schematic illustration of a LED according to another embodiment of the present invention.

In another embodiment of the present invention, the LED chip 4 of the LED 2 may be supported by a carrier substrate 17, as illustrated in FIG. 2. The carrier substrate 17 comprises a lower portion of the LED package, and may comprise any material, such as plastic, metal or ceramic.

Preferably, the carrier substrate is made out of plastic and contains a groove 19 in which the LED chip 4 is located. The sides of the groove 19 may be coated with a reflective metal 21, such as aluminum, which acts as a reflector. However, the LED chip 4 may be formed over a flat surface of the substrate 17. The substrate 17 contains electrodes 23 that electrically contact the contact layers of the LED chip 4. Alternatively, the electrodes 23 may be electrically connected to the LED chip 4 with one or two leads as illustrated in FIG. 1. If desired, the shell 14 or a glass plate may be formed over the encapsulant 11 to act as a lens or protective material.

In another embodiment of the present invention a LED array 3 may be fabricated on a plastic substrate, as illustrated in FIG. 3. The LED chips or die 4 are physically and electrically mounted on cathode leads 26. The top surfaces of the LED chips 4 are electrically connected to anode leads 25 with lead wires 27. The lead wires may be attached by known wire bonding techniques to a conductive chip pad. The leads 26, 25 comprise a lead frame and may be made of a metal, such as silver plated copper. The lead frame and LED chip array 3 are contained in a plastic package 29, such as a polycarbonate package. In some embodiments the polycarbonate comprises a bisphenol A polycarbonate. The plastic package 29 is filled with an encapsulant 11 of the present invention. The package 29 contains tapered interior sidewalls 18, which enclose the LED chips 4, and form a light spreading cavity 20, which ensures cross fluxing of LED light.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims. All Patents cited herein are incorporated herein by reference.

What is claimed is:

1. A curable epoxy resin composition for encapsulation of a solid state device, which comprises: (A) at least one cycloaliphatic epoxy resin, (B) at least one anhydride curing agent, (C) at least one a boron containing catalyst that is essentially free of halogen, (D) at least one cure modifier, and, optionally (E) at least one ancillary curing catalyst, wherein component (A) is present at a level of greater than about 60% by weight based on the combined weight of components (A), (B), (C), (D), and (E); component (C) is present at a level in a range of between about 1% by weight and about 6% by weight based on the combined weight of components (A), (B), (C), (D), and (E); component (D) is present at a level in a range of between about 1% by weight and about 6% by weight based on the combined weight of components (A), (B), (C), (D), and (E); component (E) is present at a level in a range of between about 0.01% by weight and about 10% by weight based on the combined weight of components (A), (B), (C), (D), and (E); and the molar ratio of component (B) to component (A) is less than about 0.58.

2. The composition of claim 1, wherein the cycloaliphatic epoxy resin (A) comprises at least one cycloaliphatic group and at least two oxirane rings per molecule.

3. The composition of claim 2, wherein the cycloaliphatic epoxy resin (A) comprises at least one of 2-(3,4-epoxy)cyclohexyl-5,5-spiro-(3,4-epoxy)cyclohexane-m-dioxane, 3,4-epoxycyclohexylmethyl-3,4-epoxycyclohexane-carboxylate, 3,4-epoxy-6-methylcyclohexylmethyl-3,4-epoxy-6-methylcyclohexanecarboxylate, vinyl cyclohexanedioxide, bis(3,4-epoxycyclohexylmethyl) adipate, bis(3,4-epoxy-6-methylcyclohexylmethyl)adipate, exo-exo bis(2,3-epoxycyclopentyl)ether, endo-exo bis(2,3-epoxycyclopentyl)ether, 2,2-bis(4-(2,3-epoxypropoxy) cyclohexyl)propane, 2,6-bis(2,3-epoxypropoxycyclohexyl-p-dioxane), 2,6-bis(2,3-epoxypropoxy)norbornene, the diglycidylether of linoleic acid dimer, limonene dioxide, 2,2-bis(3,4-epoxycyclohexyl)propane, dicyclopentadiene dioxide, 1,2-epoxy-6-(2,3-epoxypropoxy)hexahydro-4,7-methanoindane, p-(2,3-epoxy)cyclopentylphenyl-2,3-epoxypropylether, 1-(2,3-epoxypropoxy)phenyl-5,6-epoxyhexahydro-4,7-methanoindane, o-(2,3-epoxy) cyclopentylphenyl-2,3-epoxypropyl ether), 1,2-bis[5-(1,2-epoxy)-4,7-hexahydromethanoindanoxyl]ethane, cyclopentenylphenyl glycidyl ether, cyclohexanediol diglycidyl ether, or diglycidyl hexahydrophthalate.

4. The composition of claim 3, wherein the cycloaliphatic epoxy resin (A) comprises 3,4-epoxycyclohexylmethyl-3,4-epoxycyclohexanecarboxylate.

5. The composition of claim 1, wherein the anhydride curing agent (B) comprises at least one of bicyclo[2.2.1] hept-5-ene-2,3-dicarboxylic anhydride, methylbicyclo [2.2.1]hept-5-ene-2,3-dicarboxylic anhydride, bicyclo [2.2.1]hept-5-ene-2,3-dicarboxylic anhydride, phthalic anhydride, pyromellitic dianhydride, hexahydrophthalic anhydride, dodecenylsuccinic anhydride, dichloromaleic anhydride, chlorendic anhydride, or tetrachlorophthalic anhydride.

6. The composition of claim 5, wherein the anhydride curing agent (B) comprises hexahydrophthalic anhydride.

7. The composition of claim 1, wherein the boron containing catalyst (C) comprises a borate.

8. The composition of claim 7, wherein the borate has the structure:

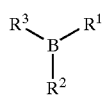

wherein $R^1$–$R^3$ are $C_{1-20}$ aryl, alkyl, or cycloalkyl residues and substituted derivatives thereof, or $C_{1-20}$ alkyloxy or cycloalkoxy residues and substituted derivatives thereof.

9. The composition of claim 8, wherein the borate is at least one member selected from the group consisting of triphenylborate, tributylborate, trihexylborate, and tricyclohexylborate.

10. The composition of claim 7, wherein the boron containing catalyst is a boroxine.

11. The composition of claim 10, wherein the boroxine has the structure:

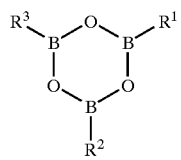

wherein $R^1$–$R^3$ are $C_{1-20}$ aryl, alkyl, or cycloalkyl residues and substituted derivatives thereof, or $C_{1-20}$ alkyloxy or cycloalkoxy residues and substituted derivatives thereof.

12. The composition of claim 11, wherein the boroxine is at least one member selected from the group consisting of triphenylboroxine, trimethylboroxine, tributylboroxine, trimethoxyboroxine, and tributoxyboroxine.

13. The composition of claim 1, wherein the cure modifier (D) comprises at least one member selected from the group consisting of alcohols and phosphites.

14. The composition of claim 13, wherein the cure modifier (D) comprises at least one member selected from the group consisting of benzyl alcohol, cyclohexanemethanol, alkyl diols, cyclohexanedimethanol, ethylene glycol, propylene glycol, butanediol, pentanediol, hexanediol, heptanediol, octanediol, polyethylene glycol, glycerol, polyether polyols; trialkylphosphites, tributyl phosphite, triarylphosphites, triphenyl phosphite, benzyldiethyl phosphite, trialkylthiophosphites, and triarylthiophosphites.

15. The composition of claim 14, wherein the cure modifier (D) comprises 2,5-hexanediol and triphenyl phosphite.

16. The composition of claim 1, wherein at least one ancillary curing agent (E) is present.

17. The composition of claim 16, wherein the ancillary curing catalyst (E) is at least one member selected from the group consisting of an organometallic salt, a sulfonium salt and an iodonium salt.

18. The composition of claim 17, wherein the ancillary curing catalyst (E) comprises at least one member selected from the group consisting of a metal carboxylate, a metal acetylacetonate, zinc octoate, stannous octoate, triarylsulfonium hexafluorophosphate, triarylsulfonium hexafluoroantimonate, diaryliodonium hexafluoroantimonate, and diaryliodonium tetrakis (pentafluorophenyl)borate.

19. The composition of claim 1, further comprising at least one of thermal stabilizers, UV stabilizers, coupling agents, or refractive index modifiers.

20. The composition of claim 19, comprising at least one coupling agent which comprises both an alkoxysilane and an organic moiety.

21. The composition of claim 20, comprising at least one coupling agent of the formula $(R^5O)_3Si$—$R^6$ wherein $R^5$ is an alkyl group and $R^6$ is selected from the group consisting of vinyl, 3-glycidoxypropyl, 3-mercaptopropyl, 3-acryloxypropyl, 3-methacryloxypropyl, and $C_nH_{2n+1}$ wherein n has the value of between 4 and 16 inclusive.

22. The composition of claim 21, wherein the coupling agent comprises glycidoxypropyltrimethoxysilane.

23. The composition of claim 1 in which the encapsulant is partially cured.

24. The composition of claim 1 in which the encapsulant is cured.

25. A curable epoxy resin composition for encapsulation of a solid state device, which comprises: (A) 3,4-epoxycyclohexylmethyl-3,4-epoxycyclohexanecarboxylate, (B) hexahydrophthalic anhydride, (C) trimethoxyboroxine, and (D) 2,5-hexanediol and triphenylphosphite, wherein component (A) is present at a level of greater than about 60% by weight based on the combined weight of components (A), (B), (C), and (D); component (C) is present at a level in a range of between about 1% by weight and about 6% by weight based on the combined weight of components (A), (B), (C), and (D); component (D) is present at a level in a range of between about 1% by weight and about 6% by weight based on the combined weight of components (A), (B), (C), and (D); and the molar ratio of component (B) to component (A) is less than about 0.37.

26. The composition of claim 25, further comprising at least one of thermal stabilizers, UV stabilizers, coupling agents, or refractive index modifiers.

27. The composition of claim 26, wherein the coupling agent comprises glycidoxypropyltrimethoxysilane.

28. The composition of claim 25 in which the encapsulant is partially cured.

29. The composition of claim 25 in which the encapsulant is cured.

30. A curable epoxy resin composition for encapsulation of a solid state device, which comprises: (A) 3,4-epoxycyclohexylmethyl-3,4-epoxycyclohexanecarboxylate, (B) hexahydrophthalic anhydride, (C) trimethoxyboroxine, (D) 2,5-hexanediol and triphenylphosphite, and (E) stannous octoate, wherein component (A) is present at a level of greater than about 60% by weight based on the combined weight of components (A), (B), (C), (D), and (E); component (C) is present at a level in a range of between about 1% by weight and about 6% by weight based on the combined weight of components (A), (B), (C), (D), and (E); component (D) is present at a level in a range of between about 1% by weight and about 6% by weight based on the combined weight of components (A), (B), (C), (D), and (E); component (E) is present at a level in a range of between about 0.05% by weight and about 5% by weight based on the combined weight of components (A), (B), (C), (D), and (E); and the molar ratio of component (B) to component (A) is less than about 0.58.

31. The composition of claim 30, wherein the molar ratio of component (B) to component (A) is less than about 0.37.

32. The composition of claim 30, further comprising at least one coupling agent.

33. The composition of claim 32, wherein the coupling agent comprises glycidoxypropyltrimethoxysilane.

34. The composition of claim 30 in which the encapsulant is partially cured.

35. The composition of claim 30 in which the encapsulant is cured.

* * * * *